(12) United States Patent
Lien et al.

(10) Patent No.: US 12,154,635 B2
(45) Date of Patent: Nov. 26, 2024

(54) MEMORY PROGRAMMING TECHNIQUES TO REDUCE POWER CONSUMPTION

(71) Applicant: SanDisk Technologies LLC, Addison, TX (US)

(72) Inventors: Yu-Chung Lien, San Jose, CA (US); Henry Chin, Fremont, CA (US); Erika Penzo, San Jose, CA (US)

(73) Assignee: SanDdisk Technologies LLC

( * ) Notice: Subject to any disclaimer, the term of this patent is extended or adjusted under 35 U.S.C. 154(b) by 74 days.

(21) Appl. No.: 17/410,265

(22) Filed: Aug. 24, 2021

(65) Prior Publication Data
US 2023/0066972 A1 Mar. 2, 2023

(51) Int. Cl.
*G11C 16/34* (2006.01)
*G11C 16/08* (2006.01)
*G11C 16/10* (2006.01)
*G11C 16/26* (2006.01)

(52) U.S. Cl.
CPC .......... *G11C 16/3459* (2013.01); *G11C 16/08* (2013.01); *G11C 16/102* (2013.01); *G11C 16/26* (2013.01)

(58) Field of Classification Search
CPC . G11C 16/0483; G11C 16/08; G11C 16/3459; G11C 16/102; G11C 16/26
See application file for complete search history.

(56) References Cited

U.S. PATENT DOCUMENTS

| | | | |
|---|---|---|---|
| 10,770,165 B1 * | 9/2020 | Cai | G11C 16/0483 |
| 2016/0372185 A1 * | 12/2016 | Shim | G11C 16/0483 |
| 2017/0125117 A1 * | 5/2017 | Tseng | G11C 16/10 |
| 2020/0211663 A1 * | 7/2020 | Baraskar | G11C 11/5642 |

* cited by examiner

*Primary Examiner* — Alfredo Bermudez Lozada
(74) *Attorney, Agent, or Firm* — Dickinson Wright PLLC; Steven C. Hurles

(57) ABSTRACT

A memory device that includes a plurality of memory cells arranged in an array is provided. A control circuitry is configured to program a single bit of data in each memory cell of the plurality of memory cells. The control circuitry is further configured to program a first set of memory cells of the plurality of memory cells using a first programming operation that includes a single programming pulse and no verify pulse and program a second set of memory cells of the plurality of memory cells using a second programming operation that includes at least one programming loop with a programming pulse and a verify pulse.

17 Claims, 20 Drawing Sheets

MEMORY PROGRAMMING TECHNIQUES TO REDUCE POWER CONSUMPTION

BACKGROUND

1. Field

The present technology relates to the operation of memory devices and more particularly to programming techniques that allow for reduced power consumption.

2. Related Art

Memory devices are typically provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in strings such that memory cells in a given string are coupled together in series, from source to drain, between a common source line and a common bit line.

Various programming techniques exist to program the memory cells to a plurality of data states. Some programming techniques offer great performance at high power demand at the expense of reliability. Other programming techniques offer improved reliability but less performance and with low power demand. There is a continuing need to improve the programming performance. In some scenario, it is observed that program operation with program verify could consume more peak power comparing to simply a program pulse and it is expected with more staggered WL layers, the situation will become more severe.

SUMMARY

An aspect of the present disclosure is related to a method of programming a memory device. The method includes the step of programming a single bit of data into each memory cell of a first set of memory cells using a first programming operation that includes a single programming pulse and no verify pulse. The method further includes programming a single bit of data into each memory cell of a second set of memory cells using a second programming operation that includes at least one programming loop with a programming pule and a verify pulse.

According to another aspect of the present disclosure, the first set of memory cells is approximately equal in number to the second set of memory cells.

According to yet another aspect of the present disclosure, the memory device includes a plurality of dies, a plurality of planes, a plurality of strings, and a plurality of word lines.

According to still another aspect of the present disclosure, the first set of memory cells is approximately equal in number to the second set of memory cells.

According to a further aspect of the present disclosure, for each combination of die, plane, and word line, the memory cells coupled with at least half of the strings are of the first set of memory cells that are programmed using the first programming operation that includes the single programming pulse and no verify pulse.

According to yet a further aspect of the present disclosure, a predetermined pattern establishes which memory cells are included in the first set of memory cells that are programmed using the first programming operation that includes the single programming pulse and no verify pulse and which memory cells are included in the second set of memory cells that are programmed using the second programming operation that includes at least one programming loop with a programming pulse and a verify pulse.

According to still a further aspect of the present disclosure, each plane includes five strings which are located between two slit etches.

According to another aspect of the present disclosure, the first set of memory cells that are programmed using the first programming operation that includes the single programming pulse and no verify pulse include the memory cells that are coupled to the strings that are immediately adjacent the slit etches.

According to yet another aspect of the present disclosure, the first set of memory cells that are programmed using the first programming operation that includes the single programming pulse and no verify pulse further includes the memory cells that are coupled to a middle string that is spaced equally between the two slit etches.

Another aspect of the present disclosure is related to a memory device that includes a plurality of memory cells arranged in an array. A control circuitry is configured to program a single bit of data in each memory cell of the plurality of memory cells. The control circuitry is further configured to program a first set of memory cells of the plurality of memory cells using a first programming operation that includes a single programming pulse and no verify pulse and program a second set of memory cells of the plurality of memory cells using a second programming operation that includes at least one programming loop with a programming pulse and a verify pulse.

According to another aspect of the present disclosure, the first set of memory cells is approximately equal in number to the second set of memory cells.

According to yet another aspect of the present disclosure, the memory device includes a plurality of dies and a plurality of strings and a plurality of word lines.

According to still another aspect of the present disclosure, for each combination of die and plane and word line, the memory cells coupled with at least half of the strings are of the first set of memory cells that are programmed by the control circuitry using the first programming operation that includes the single programming pulse and no verify pulse.

According to a further aspect of the present disclosure, a predetermined pattern establishes which memory cells are included in the first set of memory cells that are programmed by the control circuitry using the first programming operation that includes the single programming pulse and no verify pulse and which memory cells are included in the second set of memory cells that are programmed by the control circuitry using the second programming operation that includes at least one programming loop with a programming pulse and a verify pulse.

According to yet a further aspect of the present disclosure, each plane includes five strings which are located between two slit etches.

According to still a further aspect of the present disclosure, the first set of memory cells that are programmed by the control circuitry using the first programming operation that includes the single programming pulse and no verify pulse include the memory cells that are coupled to the strings that are immediately adjacent the slit etches.

According to another aspect of the present disclosure, the first set of memory cells that are programmed by the control circuitry using the first programming operation that includes the single programming pulse and no verify pulse further includes the memory cells that are coupled to a middle string that is spaced equally between the two slit etches.

Yet another aspect of the present disclosure is related to an apparatus that includes a non-volatile memory including a programming means for programming a single bit of data into each memory cell of a plurality of memory cells. The programming means is further configured to program a first set of memory cells of the plurality of memory cells using a first programming operation that includes a single programming pulse and no verify pulse and program a second set of memory cells of the plurality of memory cells using a second programming operation that includes at least one programming loop with a programming pulse and a verify pulse.

According to another aspect of the present disclosure, the first set of memory cells is approximately equal in number to the second set of memory cells.

According to yet another aspect of the present disclosure, the memory device includes a plurality of dies and a plurality of strings and a plurality of word lines.

According to still another aspect of the present disclosure, for each combination of die and plane and word line, the memory cells coupled with at least half of the strings are of the first set of memory cells that are programmed by the control circuitry using the first programming operation that includes the single programming pulse and no verify pulse.

BRIEF DESCRIPTION OF THE DRAWINGS

FIG. 11 depicts a table of when to program using 1P0V and when to program using nPnV according to a first exemplary embodiment of the present disclosure;

FIG. 14 depicts a table of when to program using 1P0V and when to program using nPnV according to a second exemplary embodiment of the present disclosure;

DETAILED DESCRIPTION

Techniques are provided for programming a memory device. A corresponding memory device with corresponding programming circuits are also provided.

A programming operation for a group of memory cells typically involves providing the memory cells in an erased state and then applying either a single programming pulse or a series of programming pulses to a selected word line containing the memory cells being programmed. In the case where the memory cells are being programmed to a single bit of data per memory cell (SLC), the memory cells can either be programmed by way of a series of programming pulses or a single programming pulse. Where multiple programming pulses are employed, the programming pulses are typically applied as parts of programming loops that also include verify pulses, which are applied to determine when programming has been completed. In one approach, incremental step pulse programming (ISPP) is performed, whereby a voltage of the programming pulse is increased by a fixed step size in each programming loop. In other words, the programming pulse of the second programming loop has a higher voltage than the programming pulse of the first programming loop, and the programming pulse of the third programming loop has a higher voltage than the programming pulse of the second programming loop, etc. This type of ISPP programming operation is hereinafter referred to as "nPnV" wherein "n" is a variable because during an ISPP programming operation, the number of programming loops (each including a programming pulse ("P") and a verify pulse ("V")) is not fixed.

In contrast to nPnV, during single pulse programming, no verify operation may be performed, i.e., programming is considered to be completed after the application of the single programming pulse. Such single pulse programming with no verify operation that follows the single programming pulse is hereinafter referred to as "1P0V." 1P0V offers reduced peak and average current consumption (ICC) by the memory device. However, since the verify pulse is skipped during 1P0V programming, some defects may not be detected.

The programming techniques that follow offer some of the benefits provided by 1P0V (i.e., power reduction) while still allowing all or substantially all defects to be detected. These advantages are achieved by programming with 1P0V on selected strings, planes, and/or dies in order to reduce ICC demand and programming with nPnV on the remaining strings, planes, and/or dies. In tests, these programming techniques have been found to reduce both peak and average ICC with minimal or no impact on reliability. The reduced power consumption can allow additional die operations to be performed in parallel under the same power limitation as compared to another memory device operating according to a known programming technique.

Figures 1A, 1B:
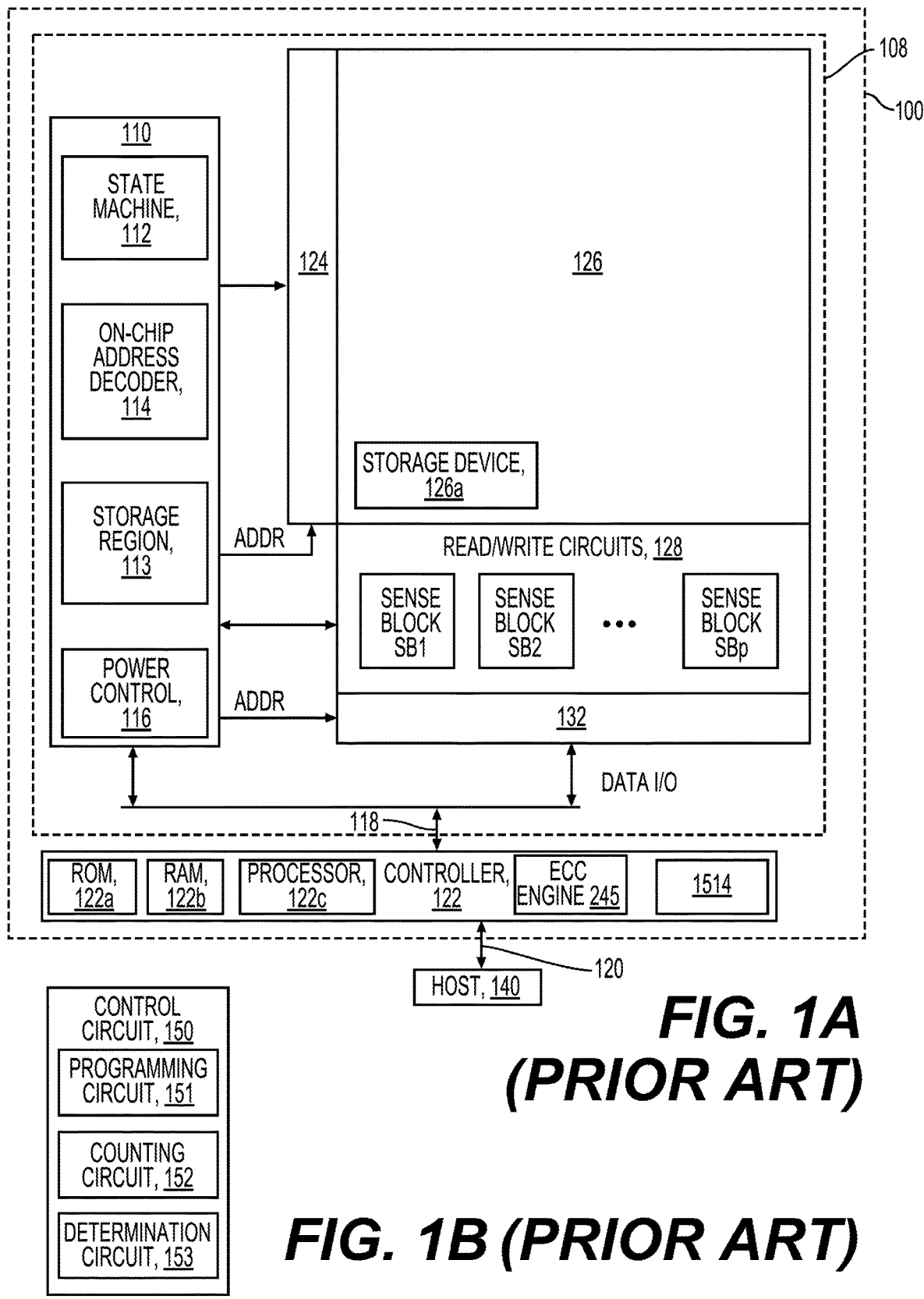
FIG. 1A is a block diagram of an example memory device.
FIG. 1B is a block diagram of an example control circuit.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. Other errors may be detected from the lower tail being too low. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
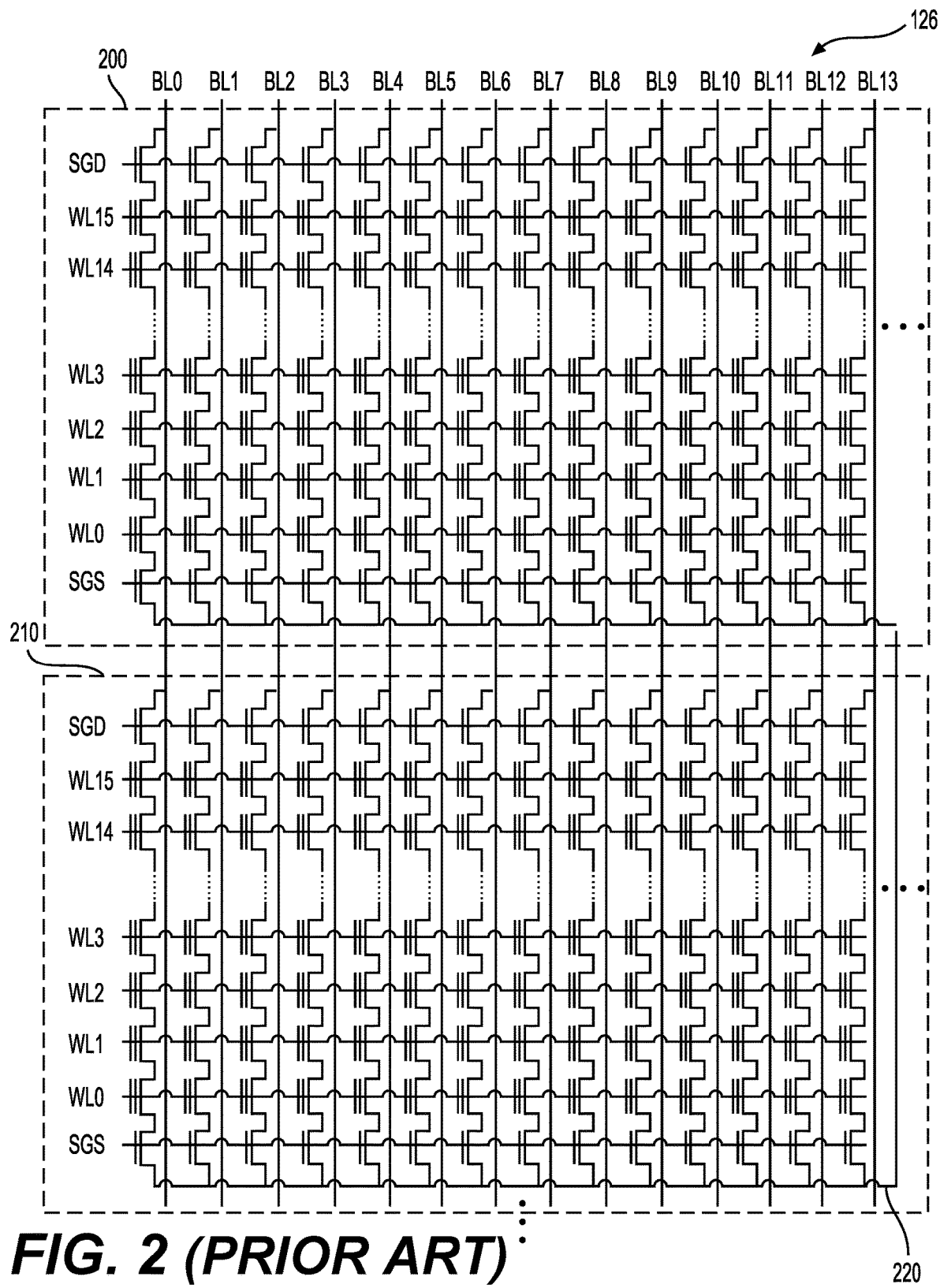
FIG. 2 depicts blocks of memory cells in an example two-dimensional configuration of the memory array of FIG. 1A.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
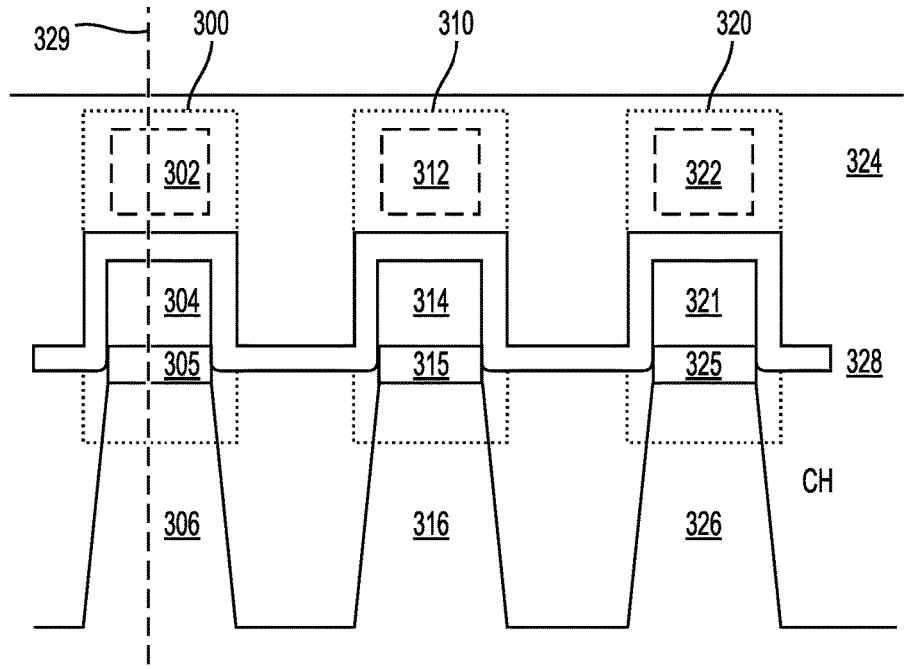
FIG. 3A and FIG. 3B depict cross-sectional views of example floating gate memory cells in NAND strings.
Figure 3B:
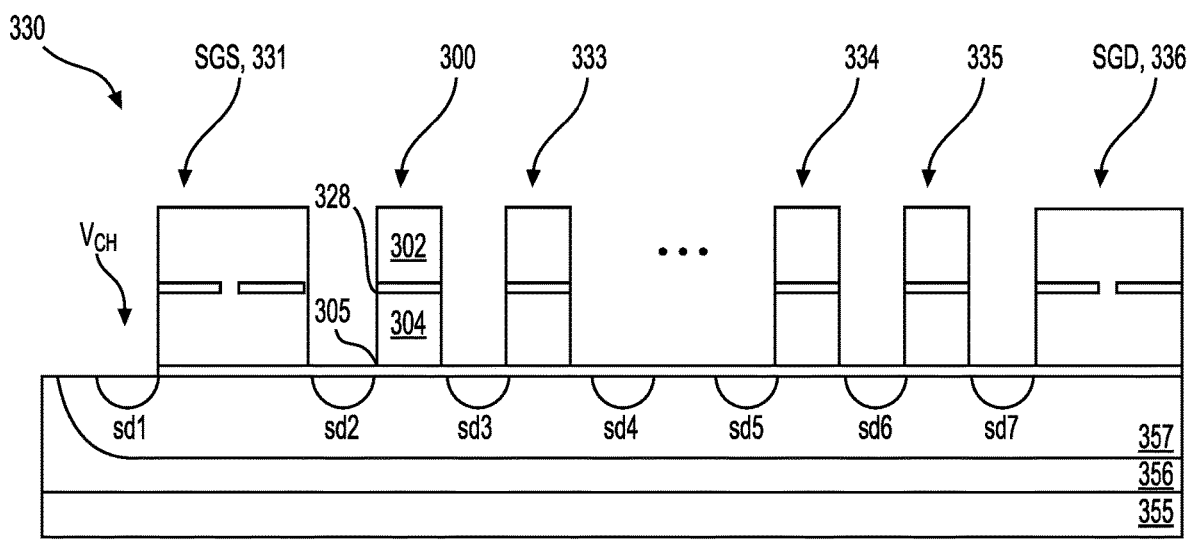

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
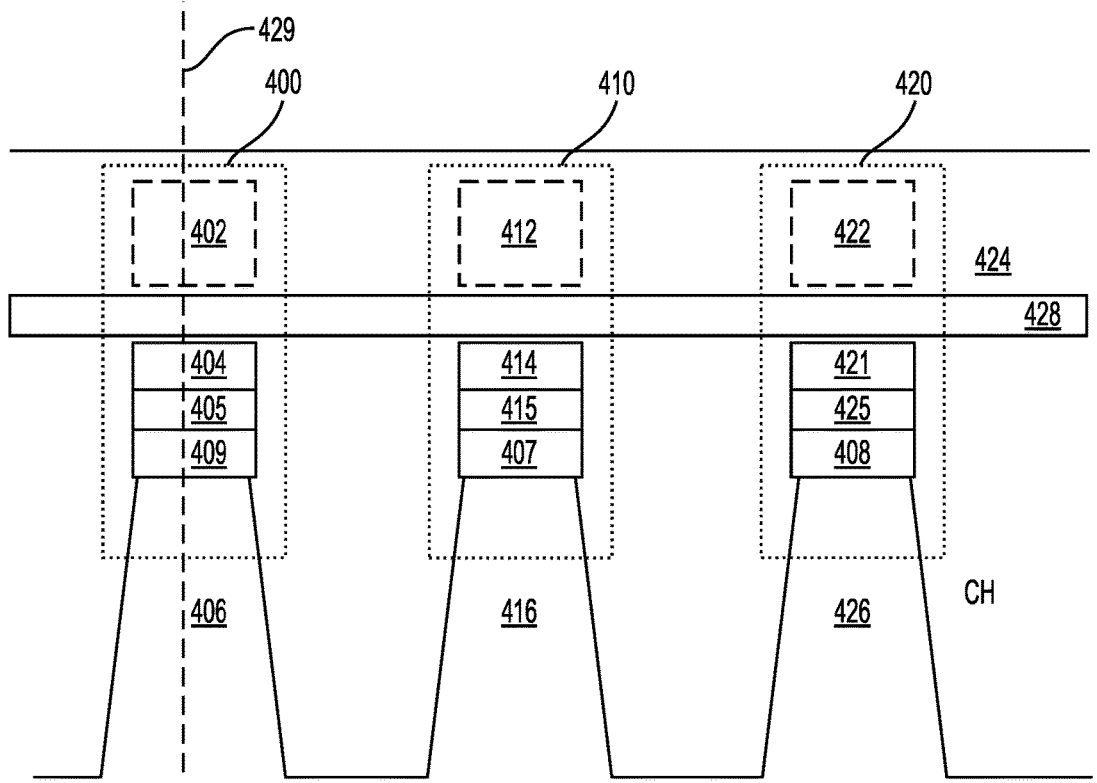
FIG. 4A and FIG. 4B depict cross-sectional views of example charge-trapping memory cells in NAND strings.
Figure 4B:
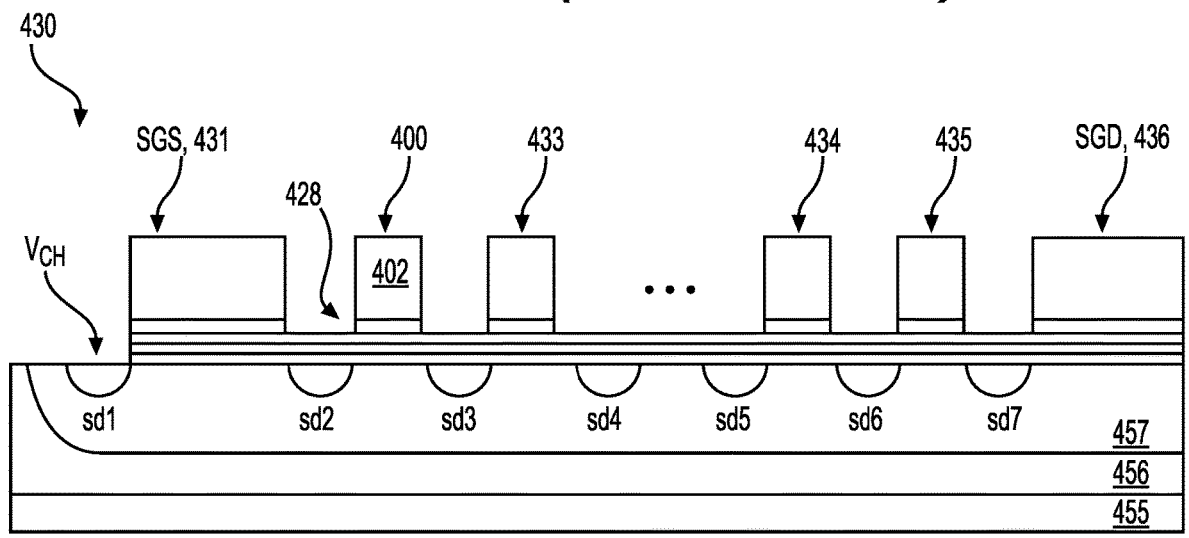

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
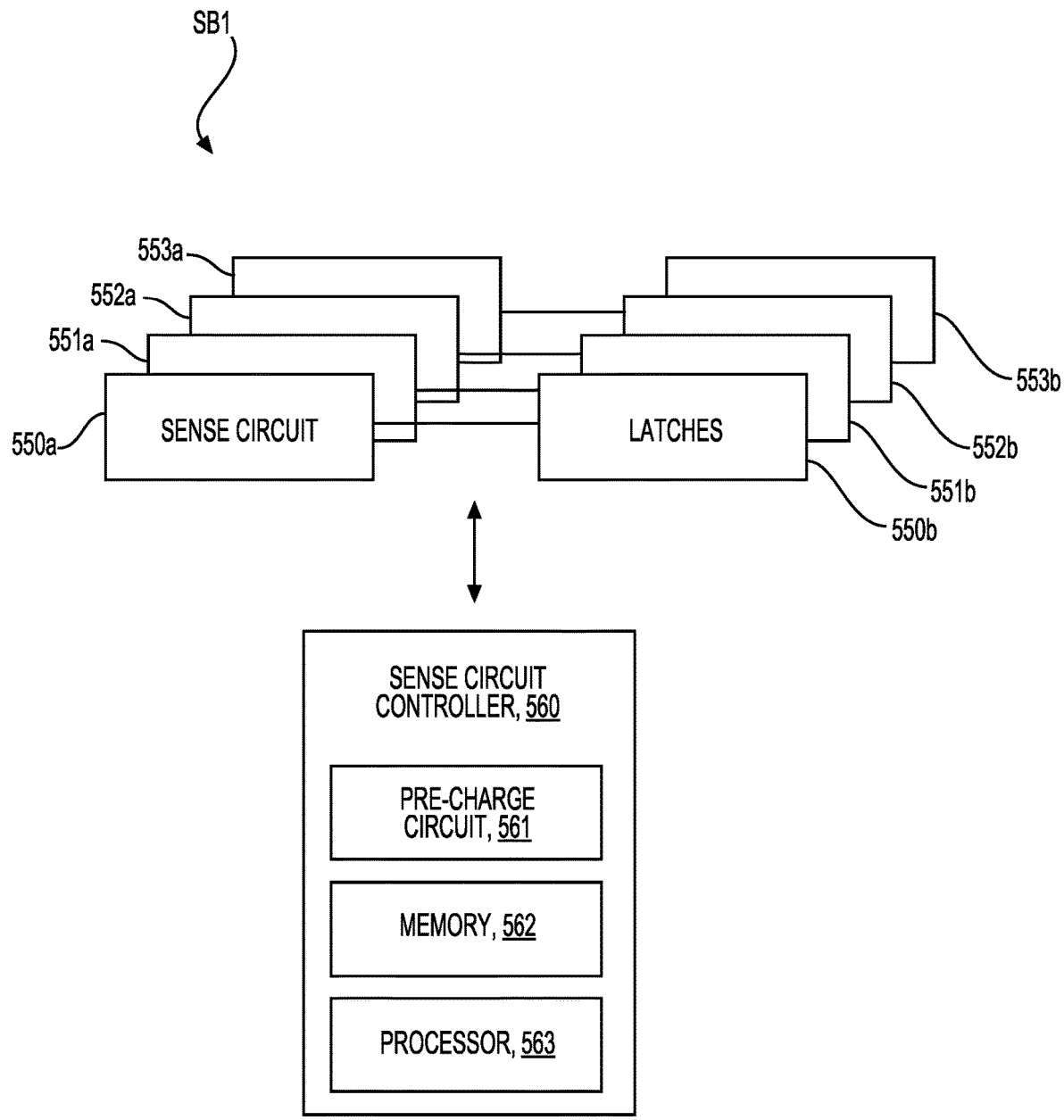
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
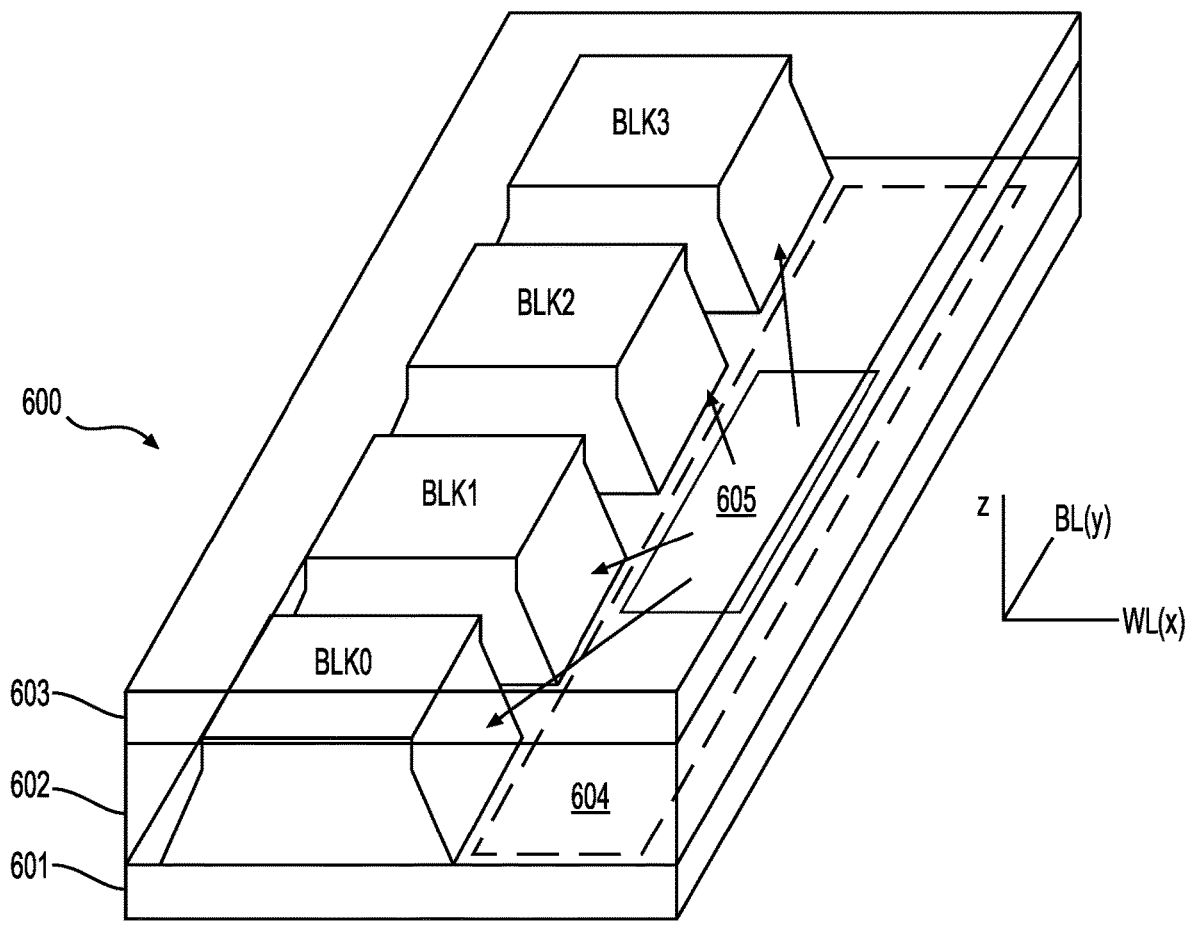
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
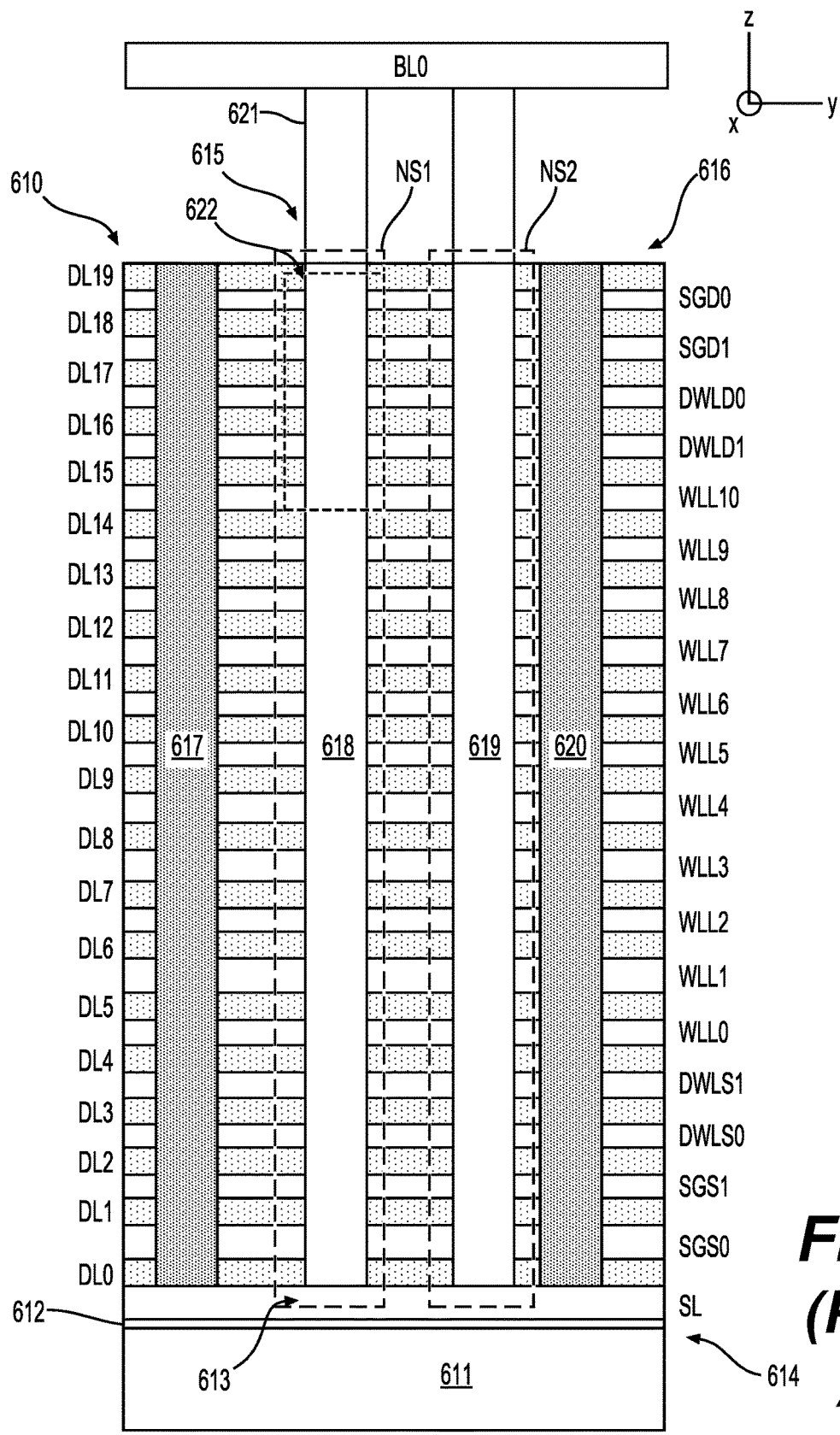
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
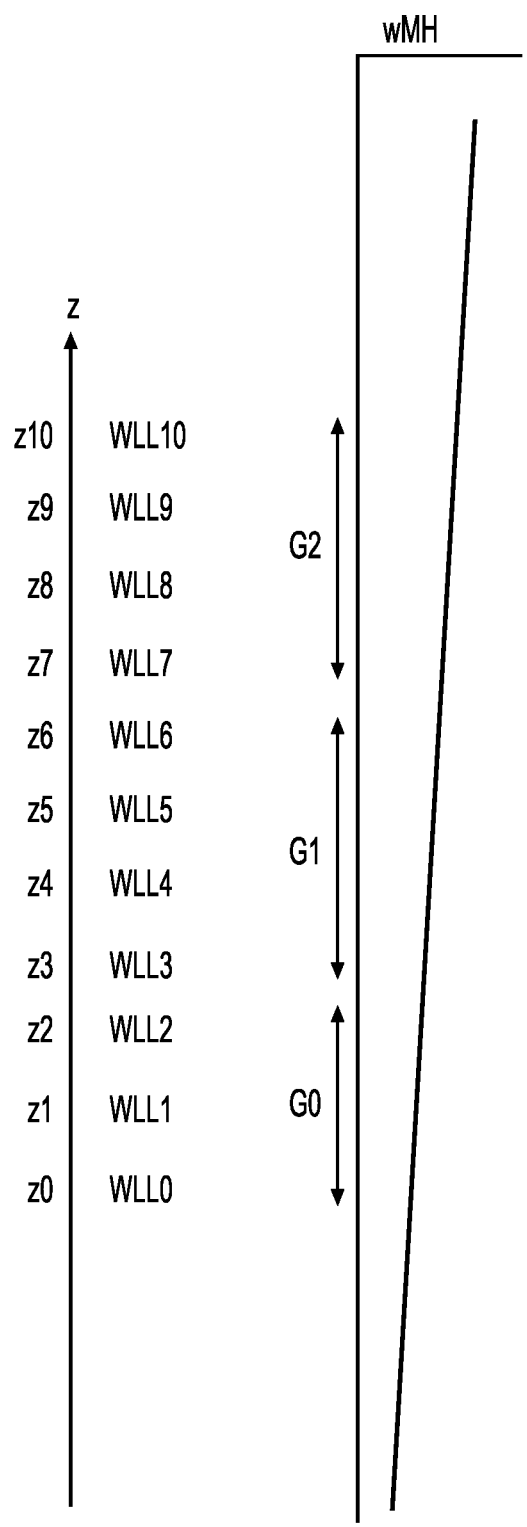
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
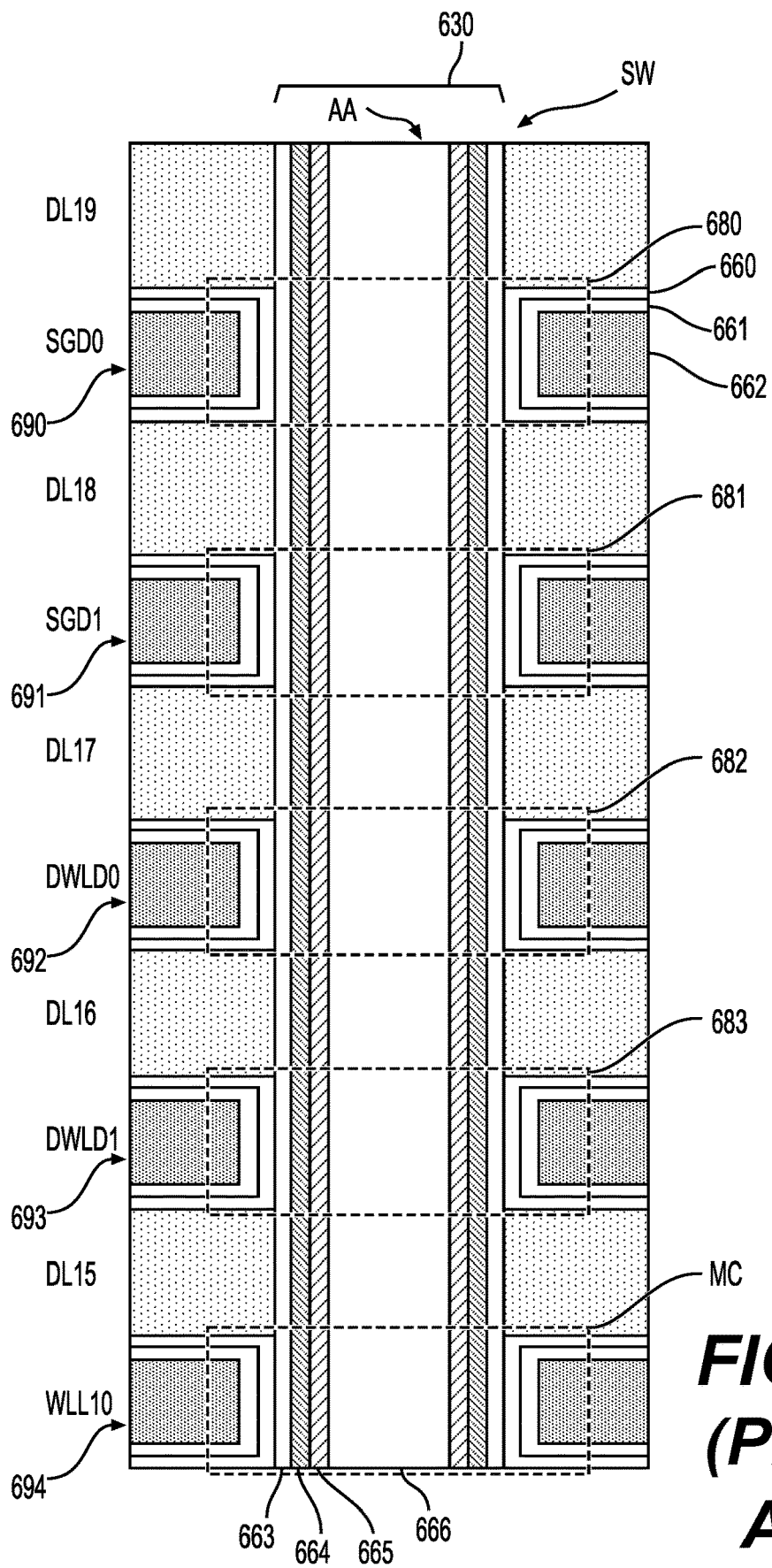
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

Each memory cell may be associated with a memory state according to write data in a program command. As used herein, a "memory state" or "data state" is a detectable characteristic of a memory cell (e.g., a threshold voltage of a NAND memory cell, a resistance of a ReRAM memory cell, a magnetization state of a magnetoresistive random access memory, etc.) that may be used to represent a data value, such as a binary data value. As used herein, the detectable characteristic of a memory cell used to represent a data value is referred to as a "programming characteristic." Based on write data in a program command, a memory cell will either remain in the erased state or be programmed to a memory state (a programmed data state) different from the erased state. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
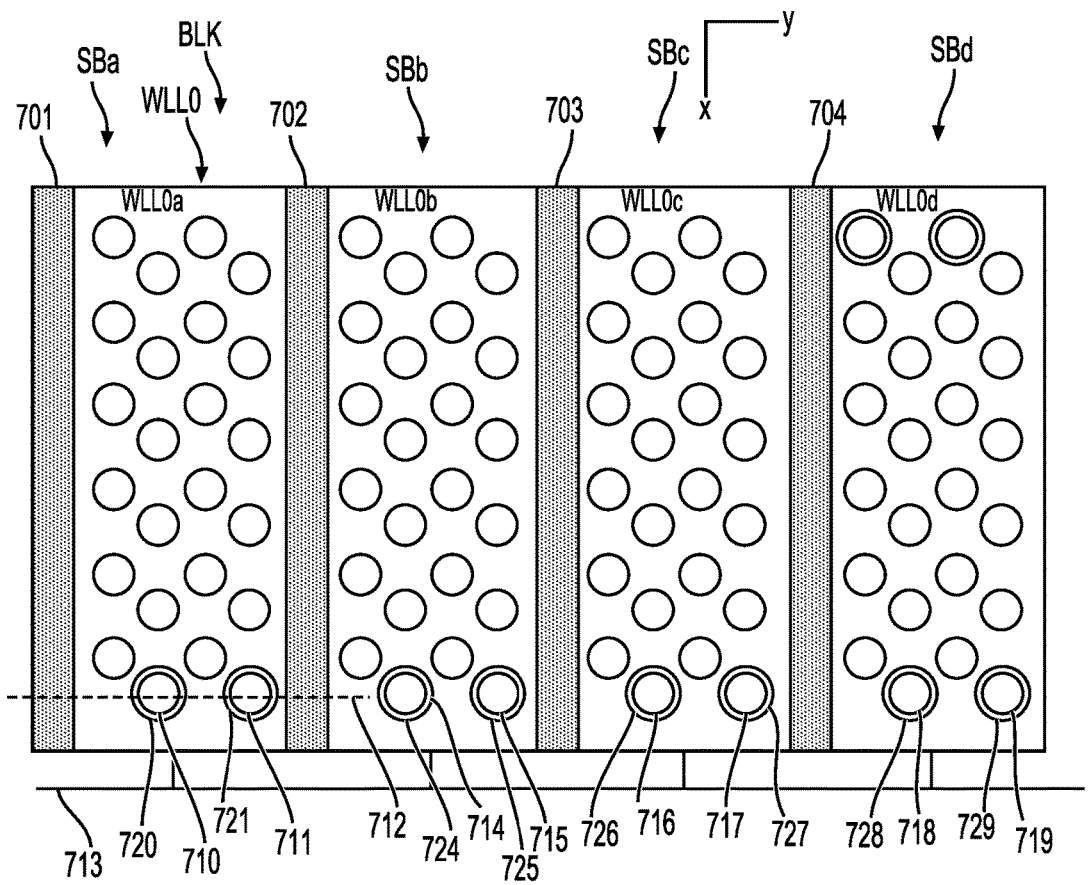
FIG. 7A depicts a top view of an example word line layer WLL0 of the stack of FIG. 6B.

FIG. 7A illustrates a top view of an example word line layer WLL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
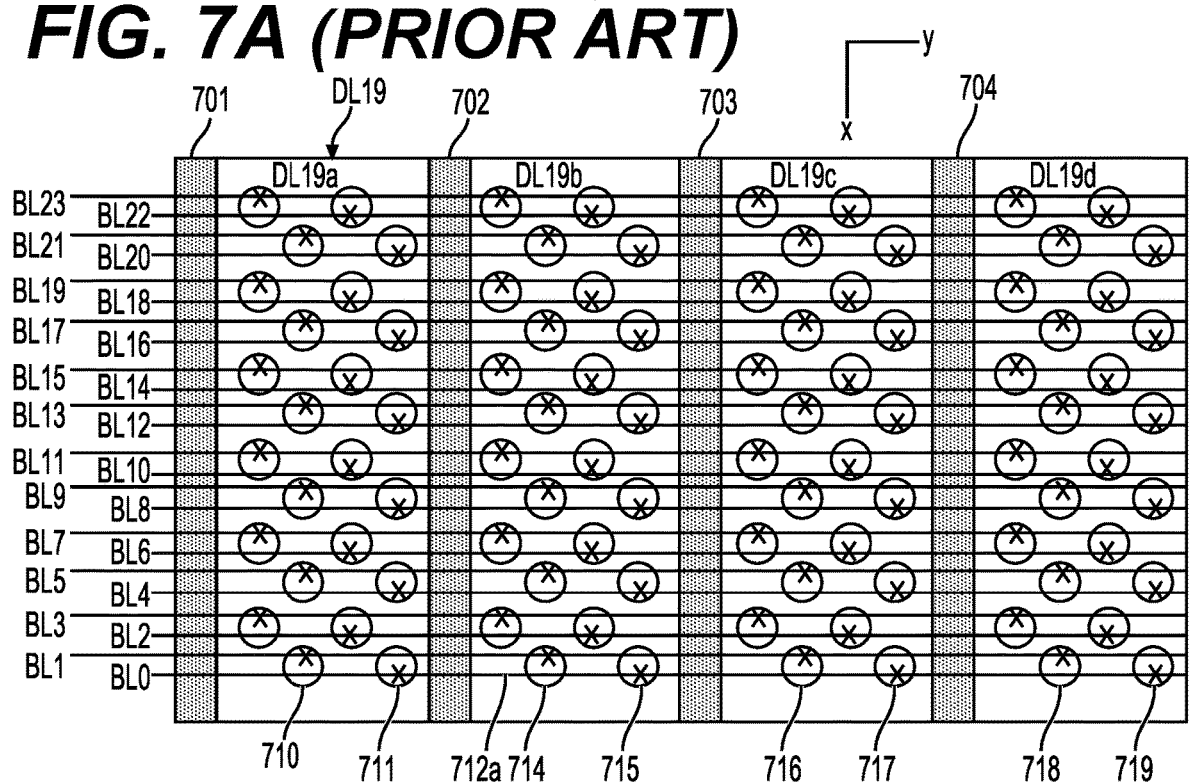
FIG. 7B depicts a top view of an example top dielectric layer DL19 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0 d which are each connected by a contact line 713. The last region of a word line layer in a block can be connected to a first region of a word line layer in a next block, in one approach. The contact line 713, in turn, is connected to a voltage driver for the word line layer. The region WLL0a has example memory holes 710, 711 along a contact line 712. The region WLL0b has example memory holes 714, 715. The region WLL0c has example memory holes 716, 717. The region WLL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, and NS3_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 820, 821 are in WLL0a, memory cells 824, 825 are in WLL0b, memory cells 826, 827 are in WLL0c, and memory cells 828, 829 are in WLL0d. These memory cells are at a common height in the stack.

Contact line connectors (e.g., slits, such as metal-filled slits) 801, 802, 803, 804 may be located between and adjacent to the edges of the regions WLL0a-WLL0d. The contact line connectors 801, 802, 803, 804 provide a conductive path from the bottom of the stack to the top of the stack. For example, a source line at the bottom of the stack may be connected to a conductive line above the stack, where the conductive line is connected to a voltage driver in a peripheral region of the memory device.

Figure 8A:
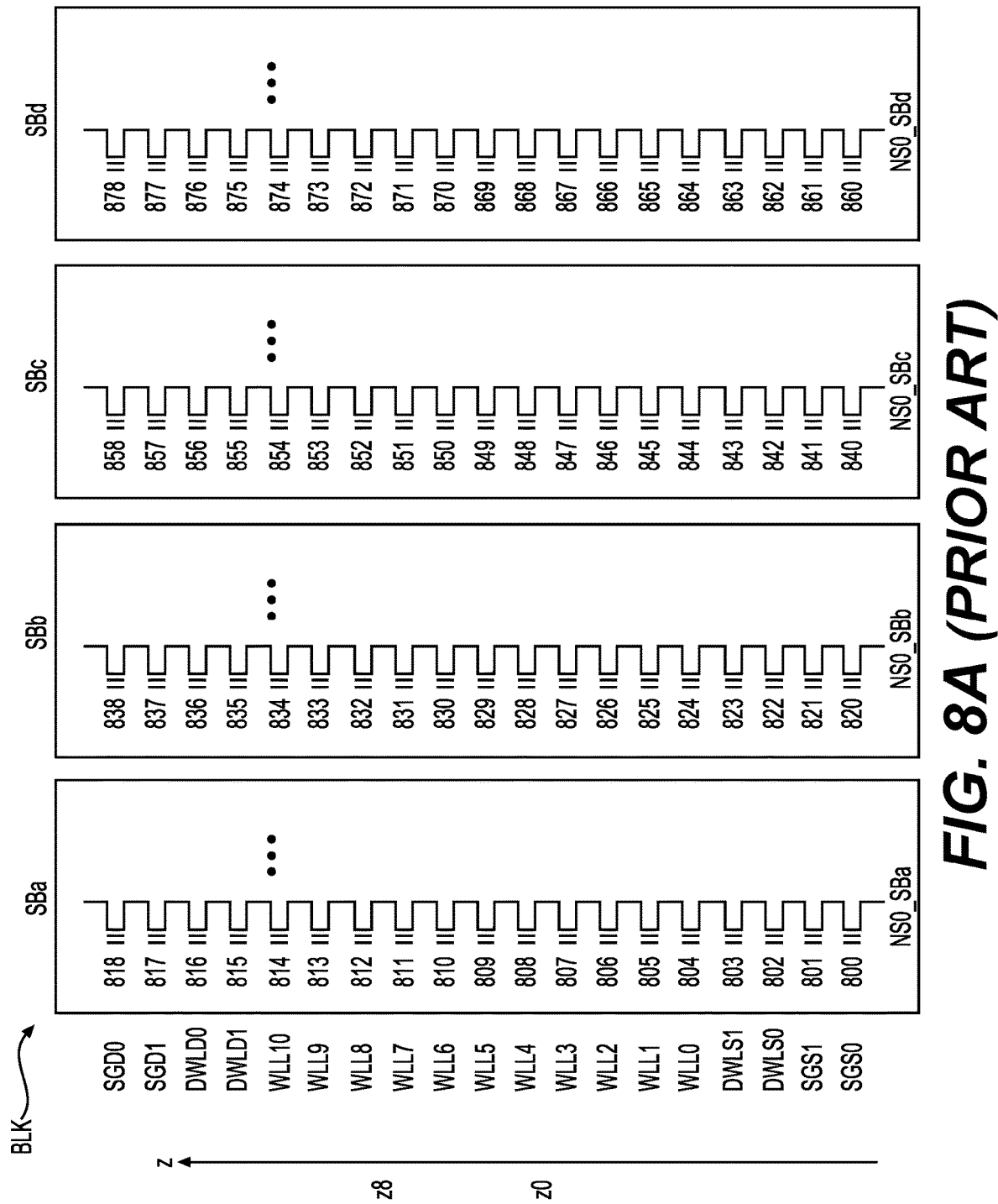
FIG. 8A depicts example NAND strings in the sub-blocks SBa-SBd of FIG. 7A.
Figure 8B:
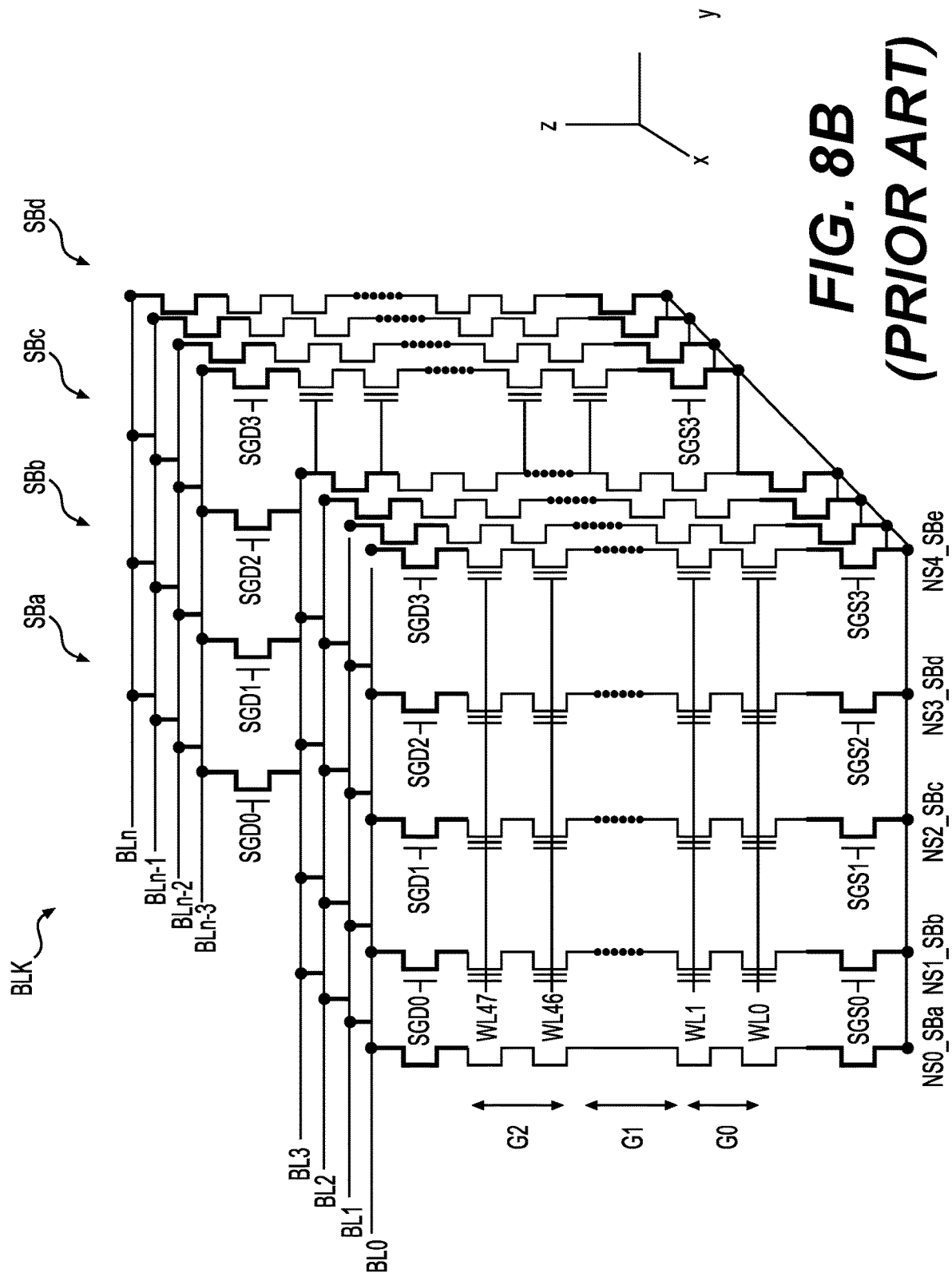
FIG. 8B depicts another example view of NAND strings in sub-blocks.
Figure 9:
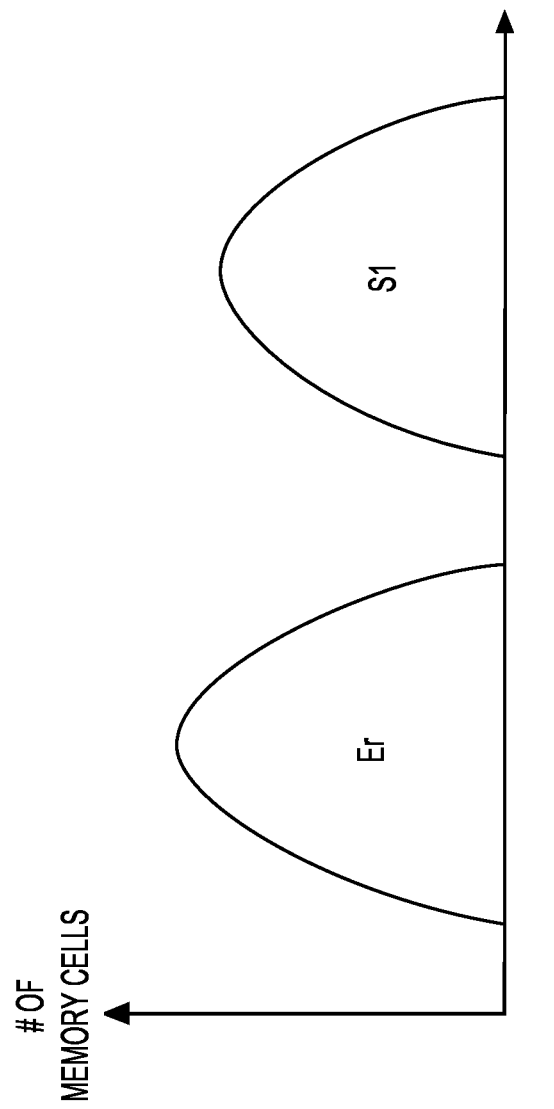
FIG. 9 illustrates the Vth distributions of the data states in an SLC memory system including an erased data state and a single programmed data state.

FIG. 8B illustrates a top view of an example top dielectric layer DL19 of the stack of FIG. 7B. The dielectric layer is divided into regions DL19a, DL19b, DL19c and DL19d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL19a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL19 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The following programming techniques utilize 1P0V programming on selected strings, planes, and/or dies and nPnV programming on others to lower both peak and average ICC during programming (as compared to only programming with nPnV) without impacting reliability.

Figure 10B:
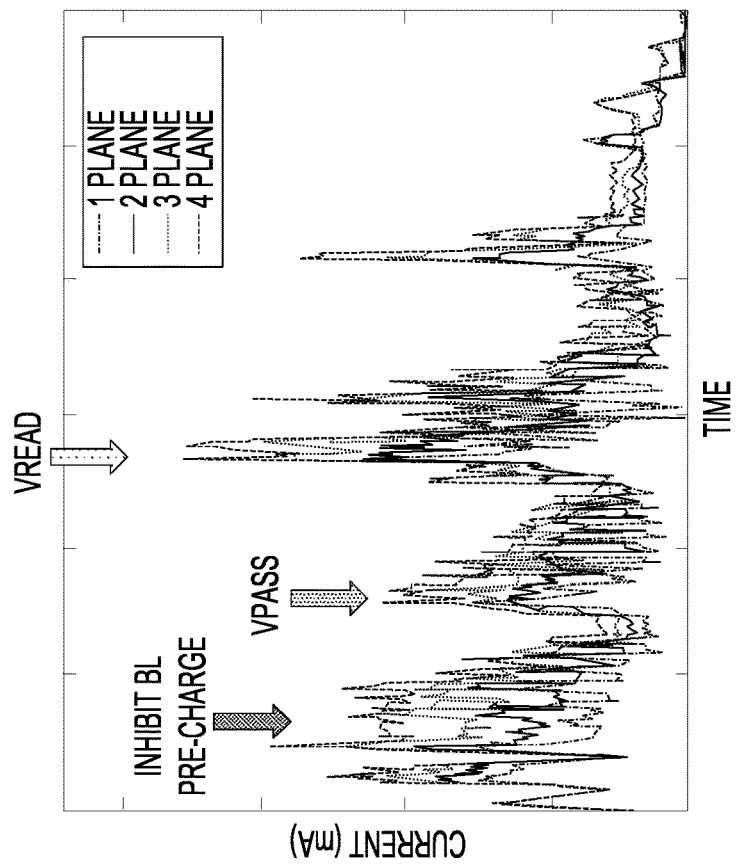
FIG. 10B depicts a plot of current versus time during nPnV programming.
Figure 10A:
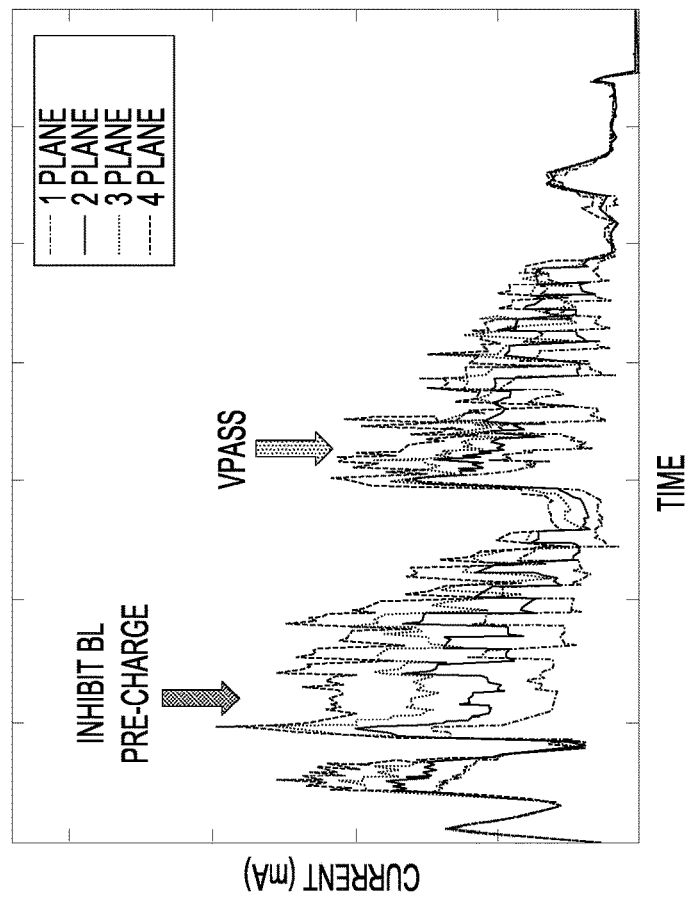
FIG. 10A depicts a plot of current versus time during 1P0V programming.

FIG. 10A depicts a plot of current versus time during a 1P0V programming operation, and FIG. 10B depicts a plot of one programming loop of an nPnV programming operation. In both of these figures, the current demand is shown where one plane is programmed alone and where two, three, or four planes are programmed in parallel. As shown in FIG. 10B, during nPnV programming, peak current occurs during the application of a VRead word line voltage as part of the verify operation, and this spike occurs whether the programming operation includes one, two, three, or four simultaneous planes. No such current spike is present during the 1P0V programming operation because there is no verify operation during 1P0V programming, and therefore, both peak and average current demand of the 1P0V programming operation are lower than the peak and average current demand, even if the nPnV programming operation only includes a single programming loop.

Figure 11:
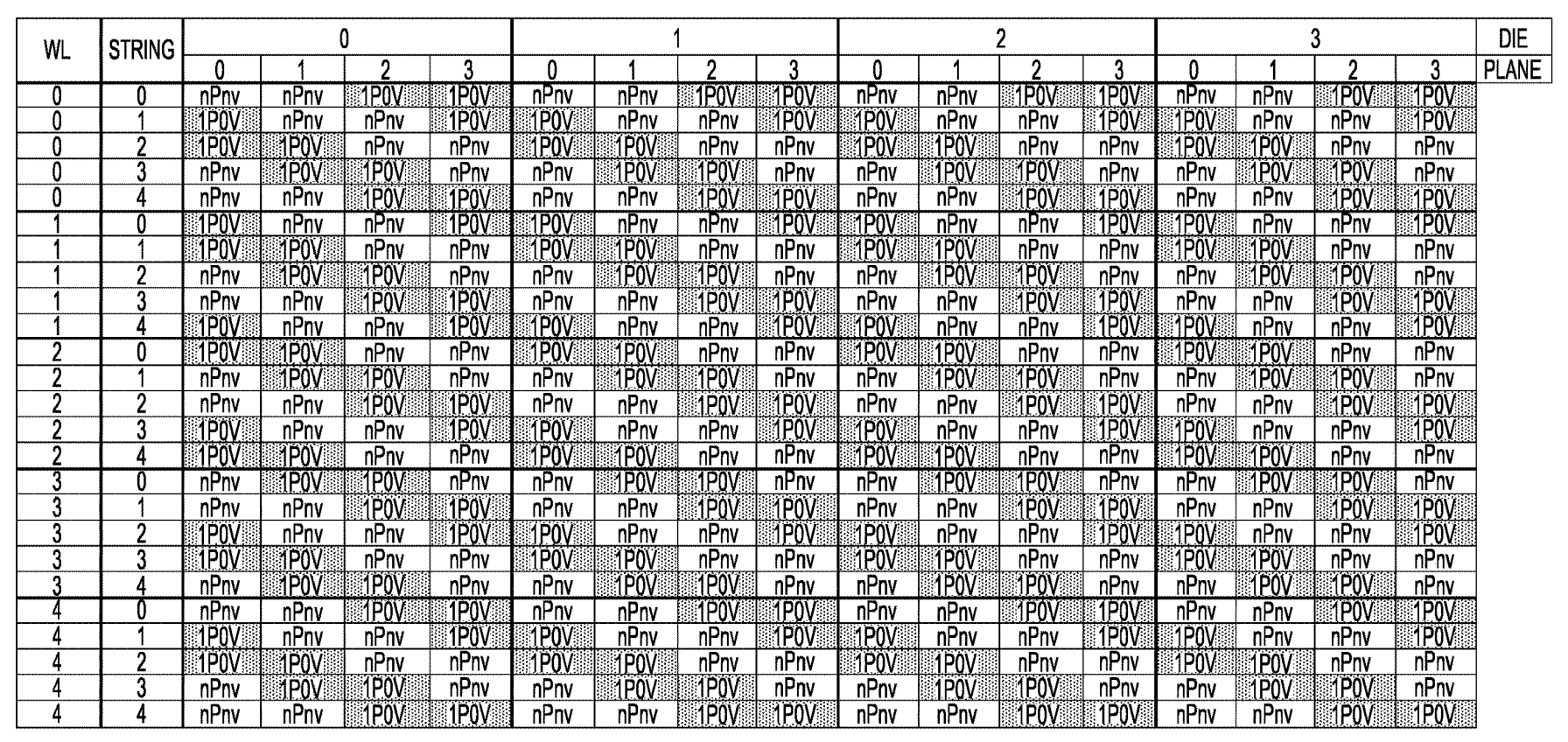
Figure 12:
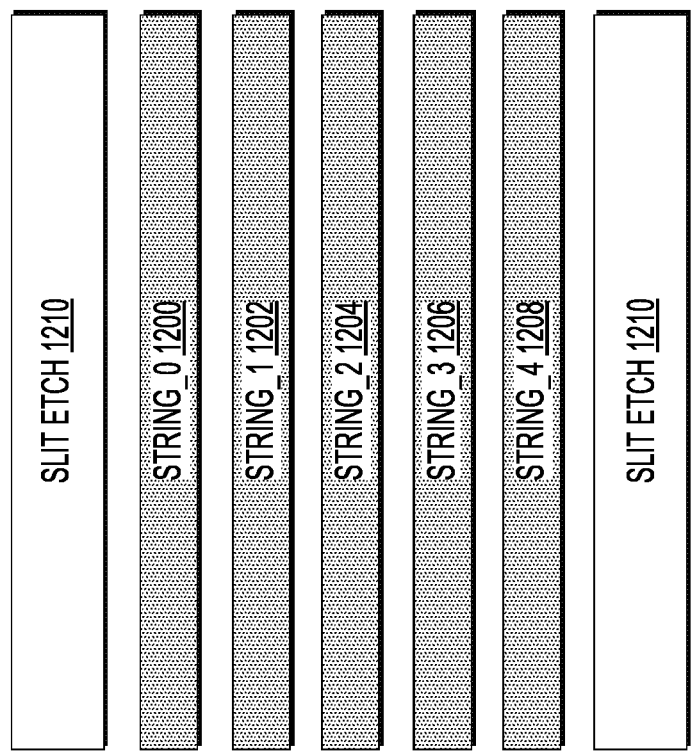
FIG. 12 is a schematic view of a plane of an exemplary memory device.

Turning now to FIG. 11, a first exemplary embodiment of an implementation of a hybrid programming operation that utilizes both 1P0V and nPnV is shown in table form. During programming, the controller follows the data contained in this table in determining when to conduct a 1P0V programming operation and when to conduct an nPnV programming operation during programming. In this example, four dies (labeled 0-3), each having four planes (labeled 0-3), and five strings (labeled 0-4) are illustrated during the programming of five word lines (labeled 0-4). FIG. 12 depicts an exemplary embodiment of a plane of the type that may be employed in the table of FIG. 11. This plane includes five physical strings, namely String_0 1200, String_1 1202, String_2 1204, String_3 1206, and String_4 1208. In this embodiment, String_0 1200 and String_4 1208 are both located adjacent respective slit etches 1210, and String_2 1204 is the most distant from the slit etches 1210. The slit edges 1210 are deep cuts of the die and are connected to respective source lines. However, it should be appreciated that the following programming techniques may apply to a range of different configurations of memory devices including varying of different numbers and arrangements of dies, planes, and strings.

Referring back to FIG. 11, in this example, each row illustrates a programming instance. Thus, there is one programming instance for each string for each word line. In the first programming instance (WL 0, String 0), for each of the four dies, nPnV programming is implemented for Planes 0 and 1, and 1P0V programming is implemented for Planes 2 and 3. In the second programming instance, (WL 0, String 1), for each of the four dies, nPnV programming is implemented for planes 1 and 2, and 1P0V programming is implemented for planes 0 and 3. This pattern continues down the table for each of the programming instances illustrated.

Within a memory die, pairs of the strings are typically connected with one another via fingers, e.g., strings 0 and 1 will be connected together via a first finger, and strings 2 and 3 will be connected with one another via a second finger. Testing has shown that when one string is defective, such as in the event of a word line or memory hole short, one other string that shares the same finger as the defective string will generally exhibit defective behavior. Therefore, while defective conditions may not be detected during the 1P0V programming operation of a defective string, by utilizing the nPnV programming operation for the other string that is attached to the same finger as the defective string, the controller is still able to detect that there is a defect and can take appropriate action. Accordingly, many defective strings can still be detected despite the wide use of 1P0V. The pattern of 1P0V and nPnV programming can be rotated for more systematic coverage during future programming operations. In other words, a string that is programmed first using 1P0V programming can be programmed using nPnV programming the next time it is programmed and vice versa.

Figure 13:
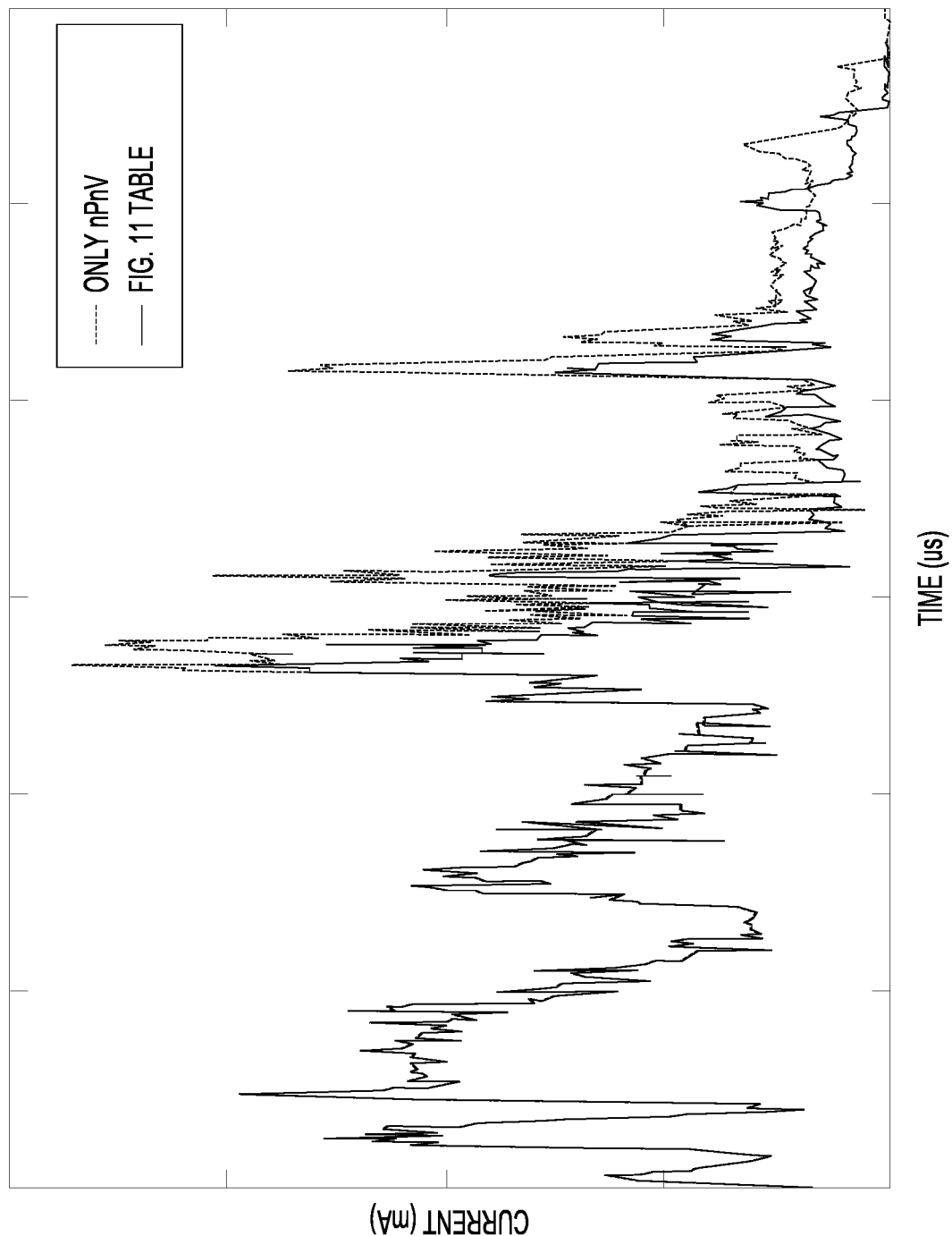
FIG. 13 is a plot of current versus time during programming according to an exemplary embodiment of the present disclosure and during programming using only nPnV programming.

Referring now to FIG. 13, a plot of current versus time is depicted comparing the programming technique of FIG. 11 to a default programming technique whereby only nPnV is utilized. As illustrated, both the average and peak current demand have been reduced by utilizing the programming technique of FIG. 11.

Because there is only a fixed amount of power that can be used across the memory device at any given time, it is common for some operations, such as programming operations, to be prioritized over other operations, e.g., erase or reading. This can result in delays of some operations until a later time when there is more power available. By reducing the power consumed during programming by utilizing the programming techniques taught herein, this can free up power to be used for other operations. Alternately, freeing up power can allow additional dies in the memory device to be operated in parallel with one another. In an example with a fixed power budget, the utilization of the programming technique illustrated in FIG. 11 has been found to allow greater than twenty-percent (20%) more dies to be operated in parallel with one another as compared to where only nPnV programming is utilized.

Referring back to the memory plane illustrated in FIG. 12, in some cases, one string of the plane may have issues that are not highly correlated to the other strings of the same plane. For example, String_0 1200 and String_4 1206 are both adjacent the respective slit etches 1210 and may be at risk of interference from the slit etches 1210 during programming. Meanwhile, the middle string, String 2, may be at risk of metal-filling issues. To address these issues, in the programming operation depicted in the table of FIG. 14, nPnV is always performed on String_0, String_2, and String_4, and 1P0V is always performed on String_1 and String_3, which are less likely to encounter errors. Thus, the strings that are most likely to be defective are always checked for defects during the verify portions the nPnV programming operation.

Figure 14:
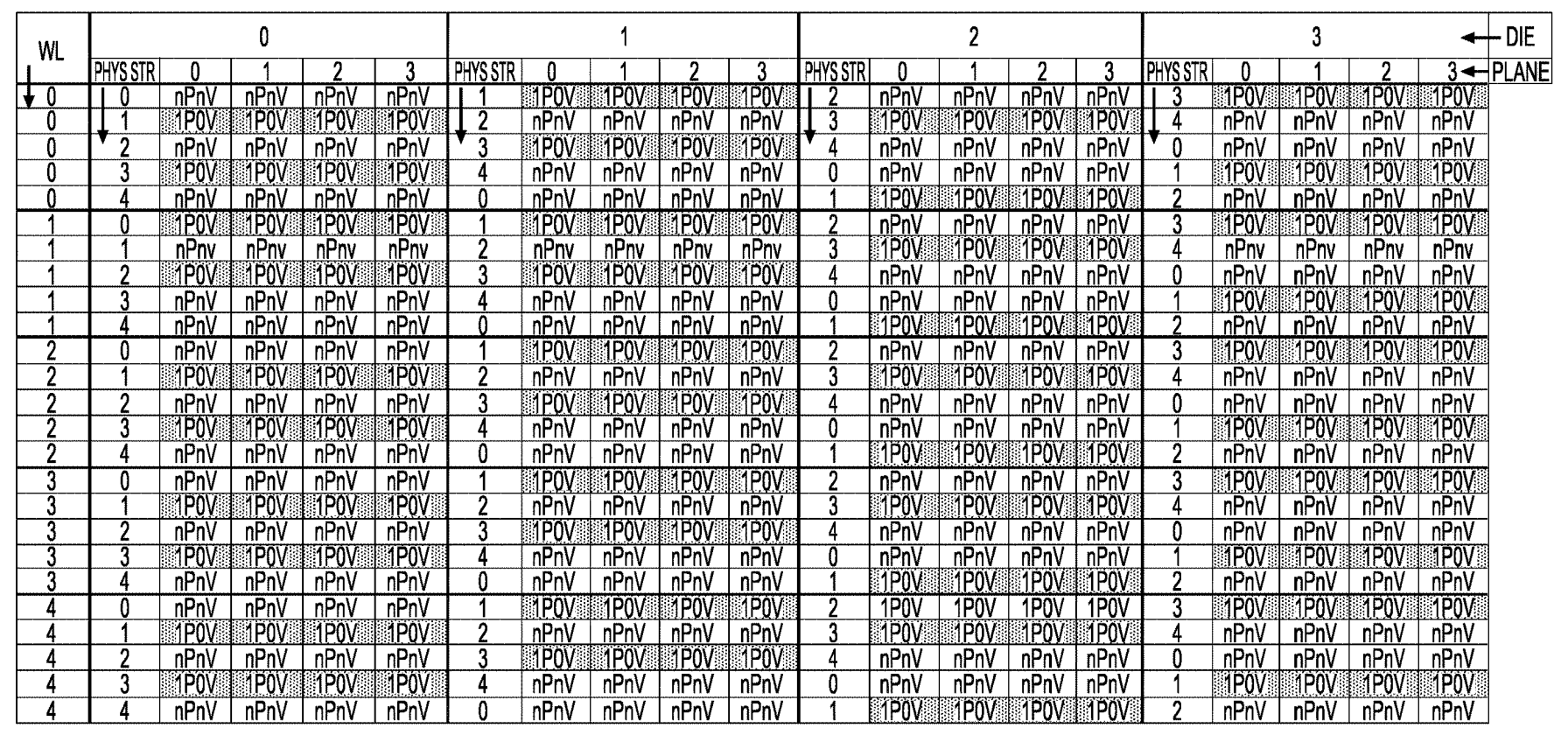

In the embodiment of FIG. 14, the order of the programming is varied by die. For example, for Die 0, for each word line, the programming order goes String_0, String_1, String_2, String_3, String_4. For Die 1, for each word line, the programming order goes String_1, String_2, String_3, String_4, String_0. For Die 2, for each word line, the programming order goes String_2, String_3, String_4, String_0, String_1. For Die 3, for each word line, the programming order goes String_3, String_4, String_0, String_1, String_2.

Figure 15:
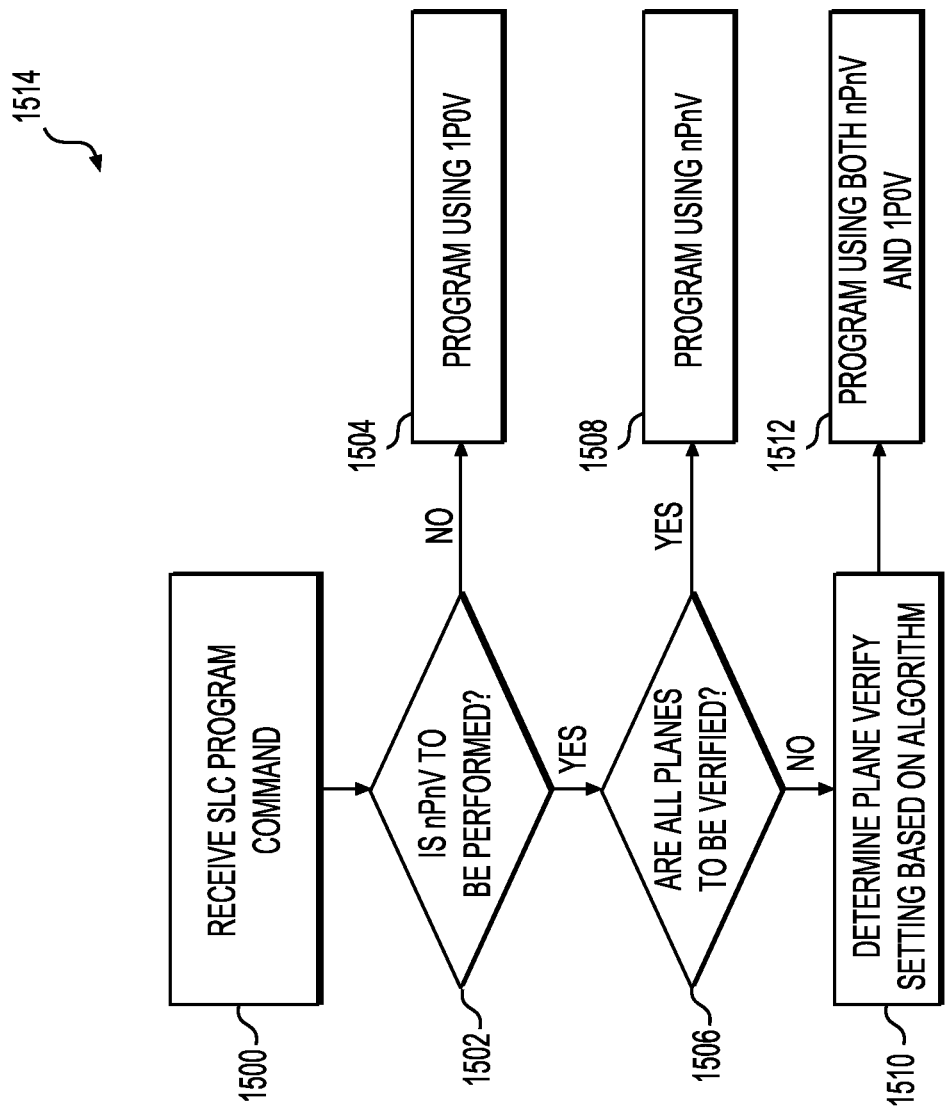
FIG. 15 is a flow chart of a programming operation according to a third exemplary embodiment of the present disclosure.

Referring now to FIG. 15, a flow chart 1514 is depicted illustrating a pseudo-random plane selection method of programming. At step 1500, a SLC programming command is received by the controller.

At decision step 1502, the controller automatically determines if the die is to be programmed using 1P0V. If the answer at decisions step 1502 is yes, then at step 1504, the controller programs the memory cells of the die using a 1P0V programming operation.

If the answer at decision step 1502 is no, then at decision step 1506, the controller automatically determines if all of the planes are to be verified. If the answer at decision step 1506 is yes, then at step 1508, the controller programs the memory cells of the die using an nPnV programming operation.

Figure 16:
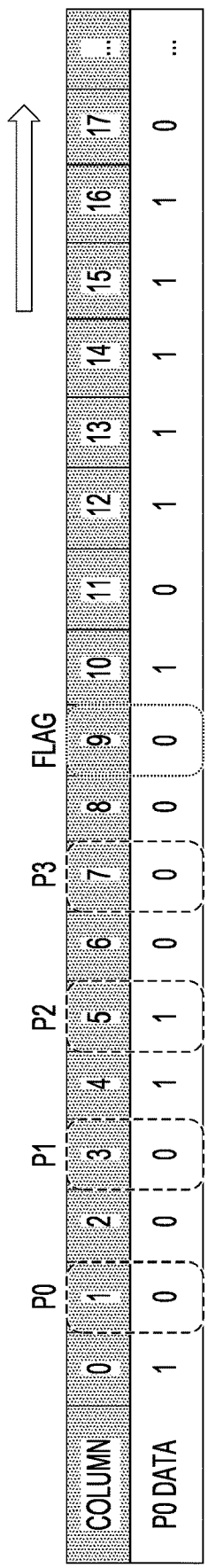
FIG. 16 illustrates data in an exemplary plane that can be used to determine whether to use nPnV or 1P0V programming during the exemplary programming operation of FIG. 15.

If the answer at decision step 1506 is no, then at step 1510, the controller determines a verify setting, which includes both nPnV and 1P0V based on an algorithm. In one example, the algorithm may be based on a pattern of data that has been programmed or is to be programmed to a certain plane, e.g., Plane 0. An exemplary pattern is shown in FIG. 16. Specific locations are selected to produce a result. In this example, Column 1 is identified as data point P0, Column 3 is data point P1, Column 5 is data point P2, Column 7 is data point P3, and Column 9 is data point Flag. The results in these columns are pseudo-random in that the data contained in the selected plane is independent of the verify setting being determined. The P0-P3 data points are added up, and the result determines which plane the verify (nPnV programming operation) is performed on. For example, if the sum of P0-P3 adds up to 1, then nPnV may be performed on only Plane 1. If the sum of P0-P3 adds up to 2, then if Flag=0, nPnV is performed only on Planes 1 and 2 and if Flag=1, then nPnV is performed only on Planes 2 and 3. If the sum of P0-P3 is 3, then nPnV is performed on all of Planes 1-3. This is just a single example of the use of an algorithm based on a data pattern to determine which planes to perform nPnV and which planes to perform 1P0V on during programming in a pseudo-random manner. It should be appreciated that a range of other pseudo-random algorithms could alternately or additionally be employed.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device using a single-level cell (SLC) programming operation, wherein the memory device includes a plurality of dies, a plurality of planes, a plurality of strings, and a plurality of word lines, the method comprising the steps of:
  in response to an SLC program command to perform the SLC programming operation on a plurality of memory cells including a first set of memory cells in a first plane of the plurality of planes and a second set of memory cells in a second plane of the plurality of planes:
    as a step in the SLC programming operation, making a determination of which of the first plane and the second plane to perform a verify operation on;
    as a step in the SLC programming operation and in response to the determination, programming only a single bit of data into each memory cell of the first set of memory cells in the first plane using a first programming operation that includes a single programming pulse and no verify pulse; and
    as a step in the SLC programming operation, in response to the determination, and subsequent to the first programming operation, programming only a single bit of data into each memory cell of the second set of memory cells in the second plane using a second programming operation that includes at least one programming loop with a programming pulse and a verify pulse.

2. The method as set forth in claim 1 wherein the first set of memory cells is approximately equal in number to the second set of memory cells.

3. The method as set forth in claim 1, wherein for each combination of die and plane and word line, the memory cells coupled with at least half of the strings are of the first set of memory cells that are programmed using the first programming operation that includes the single programming pulse and no verify pulse.

4. The method as set forth in claim 3 wherein a predetermined pattern establishes which memory cells are included in the first set of memory cells that are programmed using the first programming operation that includes the single programming pulse and no verify pulse and which memory cells are included in the second set of memory cells that are programmed using the second programming operation that includes at least one programming loop with a programming pulse and a verify pulse.

5. The method as set forth in claim 1 wherein each plane includes five strings which are located between two slit etches.

6. The method as set forth in claim 5 wherein the first set of memory cells that are programmed using the first programming operation that includes the single programming pulse and no verify pulse include the memory cells that are coupled to the strings that are immediately adjacent the slit etches.

7. The method as set forth in claim 6 wherein the first set of memory cells that are programmed using the first programming operation that includes the single programming pulse and no verify pulse further includes the memory cells that are coupled to a middle string that is spaced equally between the two slit etches.

8. A memory device, comprising:
  a plurality of dies, a plurality of planes, a plurality of strings, and a plurality of word lines;
  a plurality of memory cells including a first set of memory cells in a first plane of the plurality of planes and a second set of memory cells in a second plane of the plurality of planes; and
  control circuitry configured to program a single bit of data into each memory cell of the plurality of memory cells using a single-level cell (SLC) programming operation, the control circuitry being further configured to, in response to an SLC program command to perform the SLC programming operation on the plurality of memory cells,
    make a determination of which of the first plane and the second plane to perform a verify operation on,
    in the SLC programming operation and in response to the determination, program only a single bit of data into each memory cell of the first set of memory cells in the first plane using a first programming operation that includes a single programming pulse and no verify pulse, and
    in the SLC programming operation, in response to the determination, and subsequent to the first programming operation, program only a single bit of data into each memory cell of the second set of memory cells in the second plane using a second programming operation that includes at least one programming loop with a programming pulse and a verify pulse.

9. The memory device as set forth in claim 8 wherein the first set of memory cells is approximately equal in number to the second set of memory cells.

10. The memory device as set forth in claim 8 wherein for each combination of die and word line, the memory cells coupled with at least half of the strings are of the first set of memory cells that are programmed by the control circuitry using the first programming operation that includes the single programming pulse and no verify pulse.

11. The memory device as set forth in claim 10 wherein a predetermined pattern establishes which memory cells are included in the first set of memory cells that are programmed by the control circuitry using the first programming operation that includes the single programming pulse and no verify pulse and which memory cells are included in the second set of memory cells that are programmed by the control circuitry using the second programming operation that includes at least one programming loop with a programming pulse and a verify pulse.

12. The memory device as set forth in claim 8 wherein each plane includes five strings which are located between two slit etches.

13. The memory device as set forth in claim 12 wherein the first set of memory cells that are programmed by the control circuitry using the first programming operation that includes the single programming pulse and no verify pulse include the memory cells that are coupled to the strings that are immediately adjacent the slit etches.

14. The memory device as set forth in claim 13 wherein the first set of memory cells that are programmed by the control circuitry using the first programming operation that includes the single programming pulse and no verify pulse further includes the memory cells that are coupled to a middle string that is spaced equally between the two slit etches.

15. An apparatus including a memory device, the memory device including a plurality of dies, a plurality of planes, a plurality of strings, and a plurality of word lines, the apparatus comprising:
   a non-volatile memory including a programming means for programming, using a single-level cell (SLC) programming operation, a single bit of data into each memory cell of a plurality of memory cells including a first set of memory cells in a first plane of the plurality of planes and a second set of memory cells in a second plane of the plurality of planes, the programming means being further configured to, in response to an SLC program command to perform the SLC programming operation on the plurality of memory cells,
   make a determination of which of the first plane and the second plane to perform a verify operation on,
   in the SLC programming operation and in response to the determination, program only a single bit of data into each memory cell of the first set of memory cells in the first plane using a first programming operation that includes a single programming pulse and no verify pulse, and
   in the SLC programming operation, in response to the determination, and subsequent to the first programming operation, program only a single bit of data into each memory cell of the second set of memory cells in the second plane using a second programming operation that includes at least one programming loop with a programming pulse and a verify pulse.

16. The apparatus as set forth in claim 15 wherein the first set of memory cells is approximately equal in number to the second set of memory cells.

17. The apparatus as set forth in claim 15 wherein for each combination of die and word line, the memory cells coupled with at least half of the strings are of the first set of memory cells that are programmed by the control circuitry using the first programming operation that includes the single programming pulse and no verify pulse.

* * * * *